(12) United States Patent
Wallach

(10) Patent No.: US 10,915,457 B2
(45) Date of Patent: Feb. 9, 2021

(54) MEMORY ACCESS CONTROL THROUGH PERMISSIONS SPECIFIED IN PAGE TABLE ENTRIES FOR EXECUTION DOMAINS

(71) Applicant: Micron Technology, Inc., Boise, ID (US)

(72) Inventor: Steven Jeffrey Wallach, Dallas, TX (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/520,292

(22) Filed: Jul. 23, 2019

(65) Prior Publication Data

US 2020/0073820 A1  Mar. 5, 2020

Related U.S. Application Data

(60) Provisional application No. 62/724,896, filed on Aug. 30, 2018.

(51) Int. Cl.
| | | |
|---|---|---|
| *G06F 12/10* | (2016.01) | |
| *G06F 12/1009* | (2016.01) | |
| *G06F 12/14* | (2006.01) | |
| *G11C 11/16* | (2006.01) | |
| *G06F 9/455* | (2018.01) | |
| *G11C 8/20* | (2006.01) | |

(52) U.S. Cl.
CPC ...... *G06F 12/1009* (2013.01); *G06F 9/45533* (2013.01); *G06F 12/1441* (2013.01); *G11C 8/20* (2013.01); *G11C 11/1673* (2013.01); *G11C 11/1675* (2013.01); *G11C 11/1695* (2013.01)

(58) Field of Classification Search
None
See application file for complete search history.

(56) References Cited

U.S. PATENT DOCUMENTS

| | | |
|---|---|---|
| 4,386,399 A | 5/1983 | Rasala et al. |
| 4,409,655 A | 10/1983 | Wallach et al. |
| 4,525,780 A | 6/1985 | Bratt et al. |
| 4,821,184 A | 4/1989 | Clancy et al. |
| 6,446,188 B1 | 9/2002 | Henderson et al. |
| 7,370,193 B2 | 5/2008 | Shao et al. |
| 8,245,270 B2 | 8/2012 | Cooperstein et al. |
| 8,607,299 B2 | 12/2013 | Baker |

(Continued)

FOREIGN PATENT DOCUMENTS

WO  2013174503 A1  11/2013

OTHER PUBLICATIONS

International Search Report and Written Opinion, PCT/US2019/048015, dated Dec. 12, 2019.

(Continued)

*Primary Examiner* — Kevin Verbrugge
(74) *Attorney, Agent, or Firm* — Greenberg Traurig

(57) ABSTRACT

Systems, apparatuses, and methods related to a computer system having a page table entry containing permission bits for predefined types of memory accesses made by executions of routines in predefined domains are described. The page table entry can be used to map a virtual memory address to a physical memory address. In response to a routine accessing the virtual memory address, a permission bit corresponding to the execution domain of the routine and a type of the memory access can be extracted from the page table entry to determine whether the memory access is to be rejected.

20 Claims, 5 Drawing Sheets

(56) References Cited

U.S. PATENT DOCUMENTS

| | | | |
|---|---|---|---|
| 8,713,563 | B2 | 4/2014 | Kondoh et al. |
| 9,405,515 | B1 | 8/2016 | Bertram et al. |
| 9,519,779 | B2 | 12/2016 | Ghosh et al. |
| 9,575,784 | B1 | 2/2017 | Aron et al. |
| 9,852,084 | B1 | 12/2017 | Soderquist et al. |
| 10,043,001 | B2 | 8/2018 | Ghosh et al. |
| 2004/0133777 | A1 | 7/2004 | Kiriansky et al. |
| 2005/0257243 | A1 | 11/2005 | Baker |
| 2008/0091891 | A1 | 4/2008 | Shiota et al. |
| 2008/0250217 | A1 | 10/2008 | Kershaw et al. |
| 2008/0276051 | A1 | 11/2008 | Renno |
| 2009/0259846 | A1 | 10/2009 | Watt et al. |
| 2010/0228936 | A1 | 9/2010 | Wright et al. |
| 2010/0235598 | A1 | 9/2010 | Bouvier |
| 2012/0036334 | A1 | 2/2012 | Horman et al. |
| 2014/0173169 | A1 | 6/2014 | Liu et al. |
| 2014/0331019 | A1 | 11/2014 | Parker et al. |
| 2015/0100717 | A1 | 4/2015 | Bennett et al. |
| 2016/0110298 | A1 | 4/2016 | Koufaty et al. |
| 2016/0210082 | A1 | 7/2016 | Frank et al. |
| 2016/0350019 | A1 | 12/2016 | Koufaty et al. |
| 2016/0381050 | A1 | 12/2016 | Shanbhogue et al. |
| 2017/0060783 | A1 | 3/2017 | Chiu et al. |
| 2018/0095902 | A1 | 4/2018 | Lemay et al. |
| 2018/0121665 | A1 | 5/2018 | Anderson et al. |
| 2019/0102537 | A1 | 4/2019 | Zhang et al. |
| 2019/0196983 | A1 | 6/2019 | Khosravi et al. |
| 2020/0073693 | A1 | 3/2020 | Wallach |
| 2020/0073694 | A1 | 3/2020 | Wallach |
| 2020/0073821 | A1 | 3/2020 | Wallach |
| 2020/0073822 | A1 | 3/2020 | Wallach |
| 2020/0073827 | A1 | 3/2020 | Wallach |
| 2020/0074093 | A1 | 3/2020 | Wallach |
| 2020/0074094 | A1 | 3/2020 | Wallach |

OTHER PUBLICATIONS

International Search Report and Written Opinion, PCT/US2019/048006, dated Dec. 11, 2019.
International Search Report and Written Opinion, PCT/US2019/048008, dated Dec. 12, 2019.
International Search Report and Written Opinion, PCT/US2019/048023, dated Dec. 17, 2019.
International Search Report and Written Opinion, PCT/US2019/048020, dated Dec. 17, 2019.
International Search Report and Written Opinion, PCT/US2019/048019, dated Dec. 17, 2019.
International Search Report and Written Opinion, PCT/US2019/048013, dated Dec. 13, 2019.
International Search Report and Written Opinion, PCT/US2019/048018, dated Dec. 17, 2019.
"Hash table. Collision resolution by chaining (closed addressing)", Algorithms and Data Strcutures: with implementations in Java and C++, http://www.algolist.net/Data_structures/Hash_table/Chaining, printed on Aug. 30, 2018.
Call stack, Wikipedia, printed on Aug. 10, 2018.
Capability-based addressing, Wikipedia, printed on Sep. 13, 2018.
Explain Hashed page tables in operating system, https://cs.stackexchange.com/questions/85207/explain-hashed-page-tables-in-operating-system, printed on Aug. 17, 2018.
G. J. Myers, B. R. S. Buckingham, "A Hardware Implemenation of Capability-based Addressing", ACM SIGARCH Computer Architecture News Homepage archive, vol. 8, Iss. 6, Oct. 1980.
George Radin, Peter R. Schneider, "An Architecture for an Extended Machine With Protected Addressing", May 21, 1976.
Hash table, Wikipedia, printed on Aug. 30, 2018.
Hypervisor, Wikipedia, printed on Apr. 19, 2018.
Michael D. Schroeder, Jerome H. Saltzer, "A Hardware Architecture for Implementing Protection Rings", Presented at the Third ACM Symposium on Operating Systems Principles, Palo Alto, CA, Oct. 1971.
Page replacement algorithm, Wikipedia, printed on Jul. 31, 2018.
Page table, Wikipedia, printed on Jul. 31, 2018.
Protection ring, Wikipedia, printed on Jul. 31, 2018.
R. S. Fabry, "Capability-Based Addressing", Communications of the ACM, Jul. 1974.
Sandbox (computer security), Wikipedia, printed on Aug. 21, 2018.
Stack register, Wikipedia, printed on Aug. 10, 2018.
The RISC-V Instruction Set Manual, vol. II: Privileged Architecture, May 7, 2017.
Title: Security Configuration for Memory Address Translation from Object Specific Virtual Address Spaces to a Physical Address Space U.S. Appl. No. 16/520,311, filed Jul. 23, 2019 Inventor(s): Steven Wallach, Status: Application Undergoing Preexam Processing, Status Date: Jul. 23, 2019.
Title: Access Control for Processor Registers Based on Execution Domains U.S. Appl. No. 16/520,311, filed Jul. 23, 2019 Inventor(s): Steven Wallach, Status: Application Undergoing Preexam Processing, Status Date: Jul. 23, 2019.
Title: Domain Register for Instructions Being Executed in Computer Processors U.S. Appl. No. 16/520,298, filed Jul. 23, 2019 Inventor(s): Steven Wallach, Status: Application Undergoing Preexam Processing, Status Date: Jul. 23, 2019.
Title: Domain Crossing in Executing Instructions in Computer Processors U.S. Appl. No. 16/520,299, filed Jul. 23, 2019 Inventor(s): Steven Wallach, Status: Application Undergoing Preexam Processing, Status Date: Jul. 23, 2019.
Title: Domain Configuration of a Computer Processor Based on the Presence of a Hypervisor U.S. Appl. No. 16/520,304, filed Jul. 23, 2019 Inventor(s): Steven Wallach, Status: Application Undergoing Preexam Processing, Status Date: Jul. 23, 2019.
Title: Virtual Machine Register in a Computer Processors U.S. Appl. No. 16/520,310, filed Jul. 23, 2019 Inventor(s): Steven Wallach, Status: Application Undergoing Preexam Processing, Status Date: Jul. 23, 2019.
Title: Security Configurations in Page Table Entries for Execution Domains U.S. Appl. No. 16/520,296, filed Jul. 23, 2019 Inventor(s): Steven Wallach, Status: Application Undergoing Preexam Processing, Status Date: Jul. 23, 2019.

MEMORY ACCESS CONTROL THROUGH PERMISSIONS SPECIFIED IN PAGE TABLE ENTRIES FOR EXECUTION DOMAINS

RELATED APPLICATION

The present application claims the benefit of the filing date of Prov. U.S. Pat. App. Ser. No. 62/724,896, filed Aug. 30, 2018 and entitled "Memory Access Control through Permissions Specified in Page Table Entries for Execution Domains," the entire disclosure of which application is hereby incorporated herein by reference.

FIELD OF THE TECHNOLOGY

At least some embodiments disclosed herein relate generally to computer architecture and more specifically, but not limited to, memory access control implemented through permissions specified in page table entries for execution domains.

BACKGROUND

Instructions programmed for a computer can be structured in layers. One layer can provide resources and services for another layer. For example, a hypervisor can create or provision virtual machines that are implemented on the hardware components of the computer. An operating system can offer resources and services using resources available in a computer having predefined architecture. The computer resources or computer operated upon by the operating system can be actual computer hardware components, or virtual machine components provisioned by a hypervisor. An application can provide application specific functions using the services and resources provided by an operating system.

BRIEF DESCRIPTION OF THE DRAWINGS

The embodiments are illustrated by way of example and not limitation in the figures of the accompanying drawings in which like references indicate similar elements.

DETAILED DESCRIPTION

The present disclosure includes the techniques of controlling memory access by different, non-hierarchical, domains of executions based on respective permission sets specified in page table entries.

In a traditional system, different layers of instructions (e.g., user applications vs. operating system) may be given different levels of privilege and/or trust. Conventionally, protection rings have been constructed and implemented in computers to protect data and functionality from fault and malicious behaviors based on a hierarchy of rings. Rings are statically arranged in the hierarchy from most privileged (and thus most trusted) to least privileged (and thus least trusted). For example, the hierarchy can include a ring of operating system kernel that is the most privileged, a ring of device drivers, and a ring of applications that are the least privileged. A program or routine in a lower privilege ring can be limited by a respective special hardware enforced control gate to access the resources and services of a higher privilege ring in the hierarchy. Gating access between rings can improve security.

In the techniques of the present disclosure, instructions or routines programmed for a computer system can be classified into a set of predefined, non-hierarchical, domains, such as a domain of hypervisor, a domain of operating system, a domain of application, etc. The routines can access memory resources via virtual memory addresses that are translated to physical memory addresses via one or more page tables. A physical memory region can be explicitly configured to have different permissions for different domains, without relying upon a static domain hierarchy.

Figure 1:
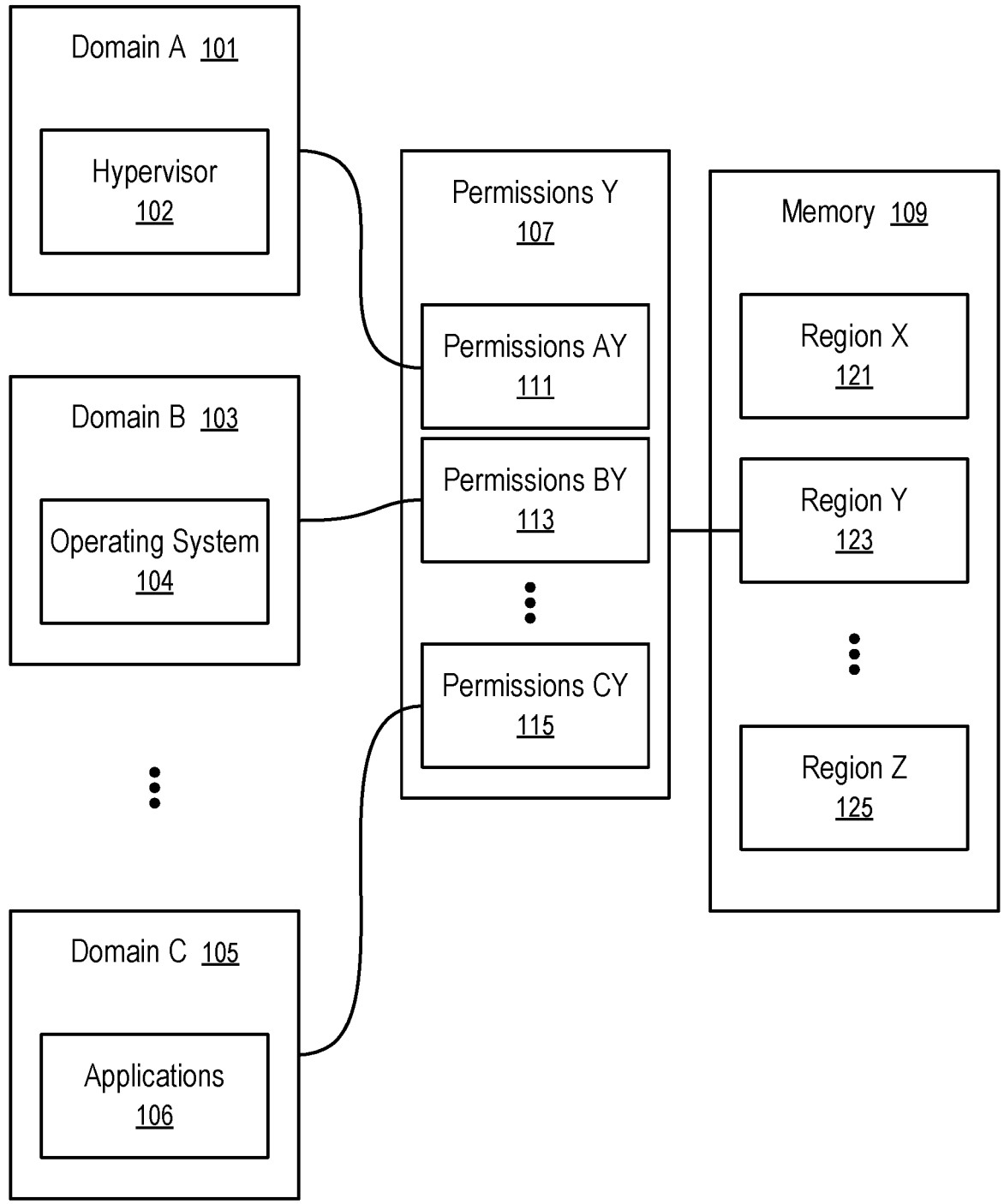
FIG. 1 shows a system to control memory access according to some embodiments.

FIG. 1 shows a system to control memory access according to some embodiments.

The system of FIG. 1 includes physical memory (109) that can be used to store data and instructions for various routines programmed for a computer system.

In general, a routine can include a pre-programmed set of instructions stored in the memory (109). The routine can also have input data, output data, and/or, temporary data stored in the memory (109). A routine can invoke or call another routine for services and/or resources. The calling routine and the called routine can be in a same domain or different domains (e.g., 101, 103, . . . , 105). Different regions (121, 123, . . . , 125) in the memory (109) can be configured with different permission sets (e.g., 107); and each permission set (e.g., 107) can include different permissions (e.g., 111, 113, . . . , 115) for respective domains (101, 103, . . . , 105) that requests access to the memory region (123). The permissions (107) can be specified, for example, in a page table entry used in logical to physical address translation of virtual memory addresses, such that the structure of the memory regions (121, 123, . . . , 125) can correspond to the memory page structure, as further discussed below in connection with FIG. 3.

In FIG. 1, the physical memory (109) is divided into multiple regions (121, 123, . . . , 125). For example, each region (e.g., 123) can be a page of physical memory (109) for memory management, or a set of pages of physical memory (109).

A typical region Y (e.g., 123) can have a respective set of permissions Y (107) specified for the set of predefined domains (101, 103, . . . , 105). For example, routines of a hypervisor (102) can be classified in a domain A (101); routines of an operating system (104) can be classified in another domain B (103); and routines of applications (106) can be classified in a further domain C (105). A hypervisor or virtual machine monitor (VMM) creates and manages virtual machines. The hypervisor can control basic functions such as physical memory and input/output (I/O). The permissions Y (107) explicitly identify the permissions (111, 113, . . . , 115) for the domains (101, 103, . . . , 105) respectively. Thus, the privileges of routines to access the region (123) are not dependent on a hierarchy of the domains (102, 103, . . . , 105).

For example, a routine in the domain (103) can be programmed for an operating system (104) and configured to use the memory region Y (123) for storing instructions and/or data. When another routine in the domain (101) for a hypervisor (102) accesses the memory region (123) for read, write, or execution of instructions, the permission (111) specified for the domain (101) to access the region (123) is checked. Whether or not to block or reject an access to the memory region (123) for a particular type of operations (e.g., read, write, execution) by an execution in the domain (101) can be determined based on a permission bit (e.g., in 111) that is specified for the domain (101), for the memory region (123), and for the type of operations. Thus, the access control can be independent of a relative hierarchy between the domain (103) and the domain (101).

Similarly, consider a routine in the domain (103) that is programmed for an operating system (104) and configured to use the memory region Y (123) for storing instructions and/or data. When another routine in the domain (105) for an application (106) accesses the memory region (123) for a type of operations (e.g., read, write, or execution), the permission (115) specified for the domain (105) to access the region (123) is checked. Whether or not to block or reject the accesses of an application (106), executed in the domain (103), to the memory region (123) can be determined based on the permission (115) specified for the domain (105) and for the memory region (123). Thus, the access control can be independent of a relative hierarchy between the domains (e.g., 103 and 105).

In general, different routines of a same domain (e.g., 103) can be configured to use different regions (e.g., 121, 123, . . . , 125) and thus configured to have different permissions for a same domain (e.g., 101 or 105).

Further, a routine can be configured to store different portions of its data in different regions (e.g., 121, 123, . . . , 125) and thus configured to have different permissions for a same domain (e.g., 101, 103, . . . , or 105).

Since the memory access control system of FIG. 1 does not rely upon a predefined domain hierarchy of trust (i.e., non-hierarchical), it can provide better flexibility and finer control granularity than the conventional protection rings.

Figure 2:
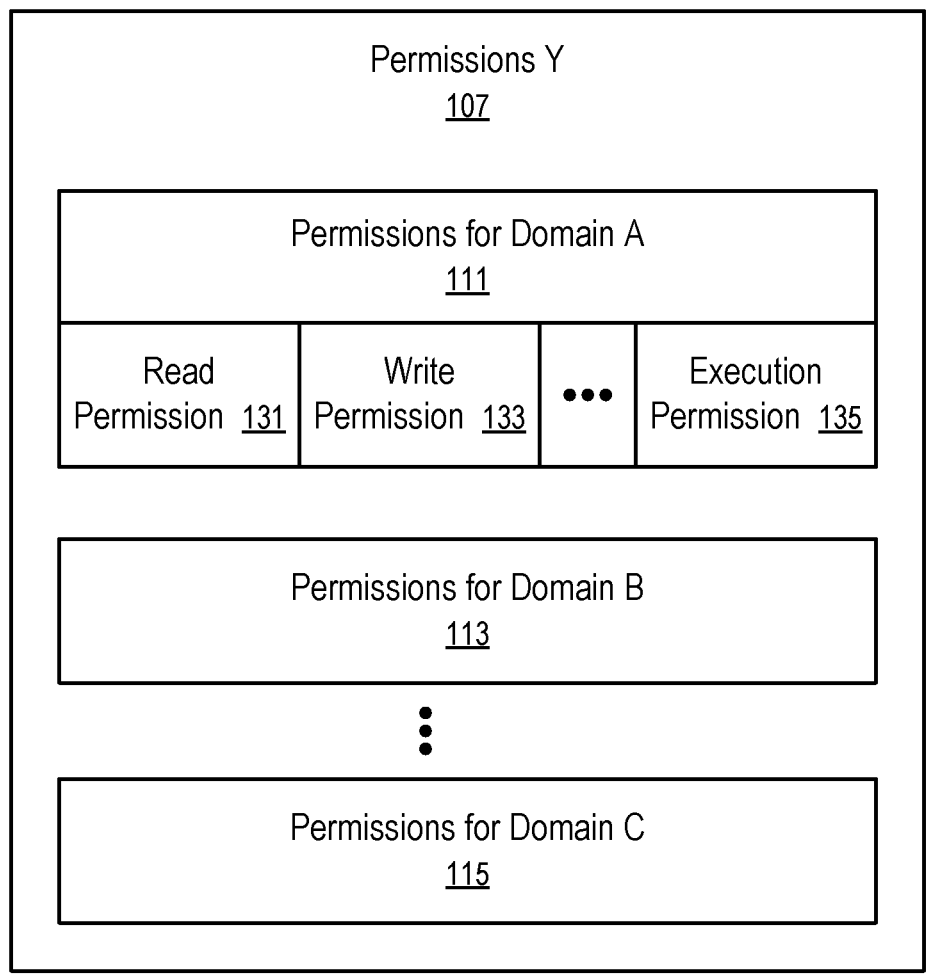
FIG. 2 shows a permission structure that can be used in the system of FIG. 1.

FIG. 2 shows a permission structure that can be used in the system of FIG. 1.

In FIG. 2, a set (111, 113, . . . , or 115) of permission bits is specified for each domain (101, 103, . . . , or 105). Each set (e.g., 111) specifies permission bits (e.g., 131, 133, . . . , 135) for a set of predefined operations, such as read, write, . . . , execution.

For example, when a routine in the domain (101) accesses the memory region (123) to read data from the region (123), the read permission (131) specified for the domain (101) is examined. If the read permission (131) is in a first predefined state (e.g., 1 or 0), the read operation of the routine is permitted; and if the read permission (131) is in a second predefined state (e.g., 0 or 1), the read operation of the routine is rejected.

For example, when a routine in the domain (101) accesses the memory region (123) to write data into the region (123), the write permission (133) specified for the domain (101) is examined. If the write permission (133) is in a first predefined state (e.g., 1), the write operation of the routine is permitted; and if the write permission (133) is in a second predefined state (e.g., 0), the write operation of the routine is rejected.

For example, when a routine in the domain (101) accesses the memory region (123) to load an instruction from the region (123) for execution, the execution permission (135) specified for the domain (101) is examined. If the execution permission (135) is in a first predefined state (e.g., 1), the execution is permitted; and if the execution permission (135) is in a second predefined state (e.g., 0), the execution request is rejected.

Figure 3:
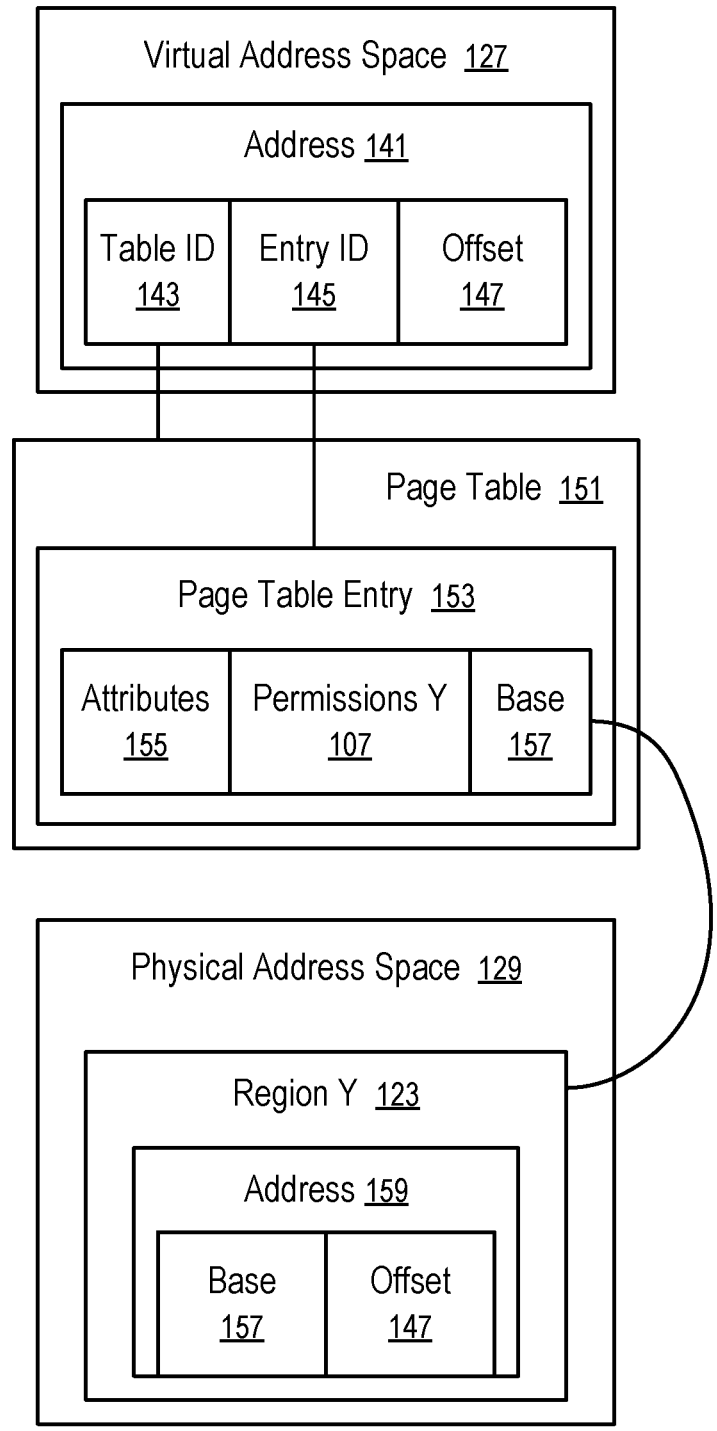
FIG. 3 illustrates a page table entry having a permission set for execution domains.

The granularity of the regions (121, 123, . . . , 125) can correspond to the memory pages in a page table for translating virtual memory addresses to physical memory addresses; and the permissions (e.g., 107) can be stored as part of a page table entry of a corresponding region (123), as illustrated in FIG. 3

FIG. 3 illustrates a page table entry (153) having a permission set (107) for execution domains (e.g., 101, 103, . . . , 105).

A typical virtual address (141) in a virtual address space (127) can be translated into a corresponding physical address (159) in a physical address space (129) using a page table (151). In general, multiple page tables (e.g., 151) can be used to map the virtual address space (127) to the physical address space (129).

The virtual address (141) can include a table ID (143), an entry ID (145), and an offset (147). The table ID (143) can be used to identify a page table (151) that contains a page table entry (153) for a page that contains the memory unit that is identified by the virtual address (141) and the physical address (159). The entry ID (145) is used as an index into the page table (151) to locate the page table entry (153) efficiently. The page table entry (153) provides a base (157) of the physical address (159). Physical addresses in the same page of memory share the same base (157). Thus, the base (157) identifies the region (123) in the memory (109). The offset (147) of the virtual address (141) is used as a corresponding offset (147) in the page or region (123) in the memory (109). The combination of the base (157) and the offset (147) provides the physical address (159) corresponding to the virtual address (141).

In FIG. 3, the page table entry (153) specifies not only the base (157) for the page or region (123), but also the permissions (107) for the page or memory region (123), including permissions (111, 113, . . . , 115) for the respective domains (101, 103, . . . , 105) illustrated in FIG. 1; and for each domain (e.g., 101), the page table entry (153) includes a permission bit (131, 133, . . . , or 135) for a respective type of access operations (e.g., read, write, . . . , or execution) as illustrated in FIG. 2.

Optionally, the page table entry (153) can specify other attributes (155) of the page of physical memory, such as whether the data in the page is valid, whether the page is in main memory, whether the page is dirty (e.g., the changes in data in the page of physical memory have not yet been flushed to a longer-term memory/storage device relative to the memory region (123)). For example, the attributes (155) can include a page fault bit indicating whether the page is in the main memory of the computer or in a storage device of the computer. If the permissions (107) allow the current access to the page of memory and the page fault bit indicate that the page is currently not in the main memory of the computer, the memory management unit (181) can swap the page from the storage device into the main memory of the computer to facilitate the access to the page identified by the page table entry (153). However, if the permissions (107) deny the current access to the page for the current execution domain, it is not necessary to evaluate the page fault bit and/or to swap in the page corresponding to the page table entry (153).

In general, the table ID (143) can be divided into multiple fields used to locate the page table (151). For example, the table ID (143) can include a top table ID identifying a top-level page table and a top table entry ID that is used as an index into the top-level page table to retrieve a page table entry containing an identifier of the page table (151), in a way similar to the entry ID (145) indexing into the page table (151) to identify the page table entry (153) containing the base (157).

In general, an entry ID (145) can be considered a virtual page number in the page table (151); and the virtual page number (e.g., 145) can be used in the page table (151) to look up the page table entry (153) containing the base (157).

For example, the table ID (143) can include a set of virtual page numbers that can be used to identify a chain of page tables (e.g., 151). Each virtual page number is used as an index in a page table (or page directory) to identify the page table entry (or page directory entry) that contains the identity or base of the next level page table (or page directory).

In some instances, different running processes in a computer can have different virtual address spaces (e.g., 127); and the process ID of a running process can be used in determine the top-level page table (or page directory). In some instances, a hash of a portion of the virtual address (141), the process ID, and/or an identification of a virtual machine hosted in the computer system can be used to locate the top-level page table (or page directory). In some instances, a hash is used as an index or key to look up a page table entry. Regardless of how the page table entry (153) is located (e.g., via indexing through multiple page tables, via the use of a hash as an index or key), the content of the page table entry (153) can be configured in a way as illustrated in FIG. 3 to provide the permissions (107) for different domains (101, 103, . . . , 105) to access the page/memory region (123) corresponding to the base (157).

In FIG. 3, the permission Y (107) for a page or region Y (123) is specified in the bottom-level page table (151), where the page table entry (153) in the bottom-level page table (151) provides the base (157) of the physical address (159).

Alternatively, or in combination, higher-level page tables (or page directories) can also have domain permission data for their page table entries (or page directory entries). For example, a page table entry (or page directory entry) identifying the page table (151) can have domain permission for all of the pages in the page table (151); and thus, the domain permission data in the page table entry is applicable to the memory region defined by the page table (151). The hierarchy of permissions specified in the chain of page table entries leading to the page table (151) and the permissions (107) in the bottom-level page table entry (153) can be combined via a logic AND operation or a logic OR operation.

For example, a routine running in a domain (e.g., 101, 103, . . . , 105) can be allowed to access a page identified by the base (157) if all of the permission bits in the chain of page table entries leading to the base (157), including the bottom-level table entry (153), have the value that allows access. Alternatively, a routine running in a domain (e.g., 101, 103, . . . , 105) can be allowed to access a page identified by the base (157) if any of the permission bits in the chain of page table entries leading to the base (157), including the bottom-level table entry (153), have the value that allows access.

For example, a routine running in a domain (e.g., 101, 103, . . . , 105) can be denied of access to a page identified by the base (157) if any of the permission bits in the chain of page table entries leading to the base (157), including the bottom-level table entry (153), have the value that denies access. Alternatively, a routine running in a domain (e.g., 101, 103, . . . , 105) can be denied of access to a page identified by the base (157) only when all of the permission bits in the chain of page table entries leading to the base (157), including the bottom-level table entry (153), have the value that denies access.

For example, when a non-bottom-level page table entry (or page directory entry) indicates that the operation is prohibited, the operations to translate from the virtual address (141) to the physical address (159) can be interrupted to reject the memory access associated with the virtual address (141). In response to the rejection, a trap to the software designated to handle the rejection is used.

Optionally, the domain permission data (e.g., 107) is specified in the bottom-level page table (151) but not in the higher-level page tables (directories).

Figure 4:
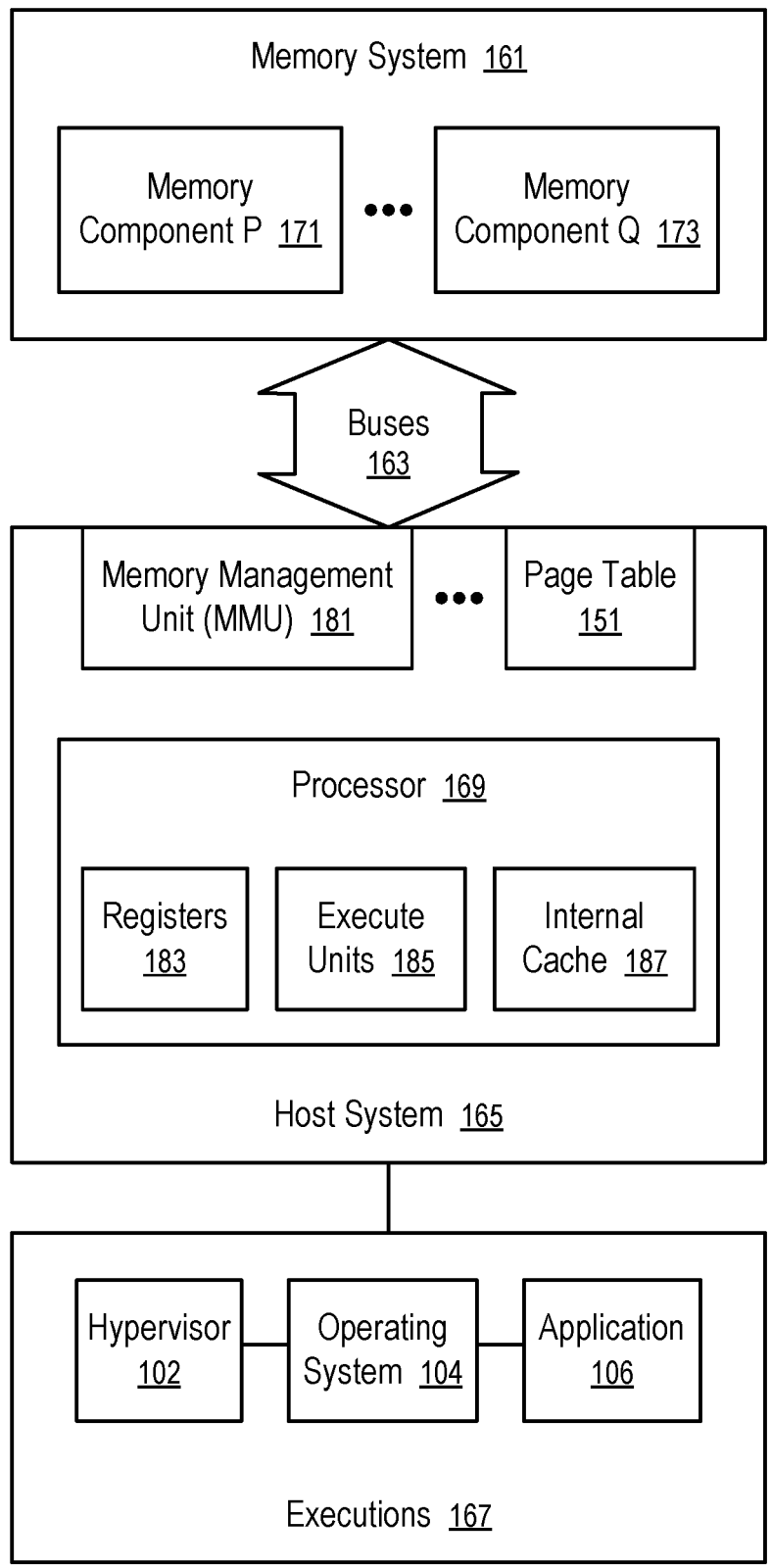
FIG. 4 shows a computer system having a page table to implement memory access permissions.

FIG. 4 shows a computer system having a page table (e.g., 151) to implement memory access permissions (e.g., 107) for execution domains (101, 103, . . . , 105).

The computer system of FIG. 4 has a host system (165) coupled to a memory system (161) via one or more buses (163). The memory system (161) has memory components (171, . . . , 173).

For example, the buses (163) can include a memory bus connecting to one or more memory modules and/or include a peripheral internet connecting to one or more storage devices. Some of the memory components (171, . . . , 173) can provide random access; and the some of the memory components (171, . . . , 173) can provide persistent storage capability. Some of the memory components (171, . . . , 173) can be volatile in that when the power supply to the memory component is disconnected temporarily, the data stored in the memory component will be corrupted and/or erased. Some of the memory components (171, . . . , 173) can be non-volatile in that the memory component is capable of retaining content stored therein for an extended period of time without power.

In general, a memory system (161) can also be referred to as a memory device. An example of a memory device is a memory module that is connected to a central processing unit (CPU) via a memory bus. Examples of memory modules include a dual in-line memory module (DIMM), a small outline DIMM (SO-DIMM), a non-volatile dual in-line memory module (NVDIMM), etc. Another example of a memory device is a storage device that is connected to the central processing unit (CPU) via a peripheral interconnect (e.g., an input/output bus, a storage area network). Examples of storage devices include a solid-state drive (SSD), a flash drive, a universal serial bus (USB) flash drive, and a hard disk drive (HDD). In some instances, the memory device is a hybrid memory/storage system that provides both memory functions and storage functions.

The memory components (171, . . . , 173) can include any combination of the different types of non-volatile memory components and/or volatile memory components. An example of non-volatile memory components includes a negative-and (NAND) type flash memory with one or more arrays of memory cells such as single level cells (SLCs) or multi-level cells (MLCs) (e.g., triple level cells (TLCs) or quad-level cells (QLCs)). In some instances, a particular memory component can include both an SLC portion and an MLC portion of memory cells. Each of the memory cells can store one or more bits of data (e.g., data blocks) used by the host system (165). Alternatively, or in combination, a memory component (171, . . . , or 173) can include a type of volatile memory. In some instances, a memory component (171, . . . , or 173) can include, but is not limited to, random access memory (RAM), read-only memory (ROM), dynamic random access memory (DRAM), synchronous dynamic random access memory (SDRAM), phase change memory (PCM), magneto random access memory (MRAM), Spin Transfer Torque (STT)-MRAM, ferroelectric random-access memory (FeTRAM), ferroelectric RAM (FeRAM), conductive bridging RAM (CBRAM), resistive random access memory (RRAM), oxide based RRAM (OxRAM), negative-or (NOR) flash memory, electrically erasable programmable read-only memory (EEPROM), nanowire-based non-volatile memory, memory that incorporates memristor technology, and/or a cross-point array of non-volatile memory cells. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased.

In general, a host system (165) can utilize a memory system (161) as physical memory (109) that includes one or more memory components (171, . . . , 173). The host system (165) can load instructions from the memory system (161) for execution, provide data to be stored at the memory system (161), and request data to be retrieved from the memory system (161).

In FIG. 4, the host system (165) includes a memory management unit (MMU) (181) and a processor (169). The processor (169) has execution units (e.g., 185), such as an arithmetic-logic unit. The processor (169) has registers (183) to hold instructions for execution, data as operands of instructions, and/or results of instruction executions. The processor (169) can have an internal cache (187) as a proxy of a portion of the memory system (161).

In some instances, the host system (165) can include multiple processors (e.g., 169) integrated on a same silicon die as multiple processing cores of a central processing unit (CPU).

Routines programmed for executing in the processor (169) can be initially stored in the memory system (161). The routines can include instructions for a hypervisor (102), an operating system (104), and an application (106). The routines stored initially in the memory system (161) can be loaded to the internal cache (187) and/or the registers (183) for execution in the execution units (185).

The running instances of the routines form the executions (167) of the hypervisor (102), the operating system (104), and the application (106). In some instances, a hypervisor (102) is not used; and the operating system (104) controls the hardware components (e.g., the memory system (161), peripheral input/output devices, and/or network interface cards) without a hypervisor.

The executions (167) of the hypervisor (102), the operating system (104), and/or the application (106) access memory (123) (e.g., in memory components (171, . . . , 173)) using virtual memory addresses (e.g., 141) defined in one or more virtual memory spaces (e.g., 127). At least one page table (151) (e.g., as illustrated in the FIG. 3) is used to translate the virtual memory addresses (e.g., 141) used in the execution to the physical memory addresses (e.g., 159) of the memory components (e.g., 171, . . . , 173).

As illustrated in FIG. 1, the executions of the routines of hypervisor (102), the operating system (104), and the application (106) can be organized into a plurality of domains (101, 103, . . . , 105). For each of the execution domains (101, 103, . . . , 105) and a memory region (123) identified by a page table entry (153), the page table entry (153) identifies a set (e.g., 111, 113, . . . , 115) of permission bits (e.g., 131, 133, . . . , 135) for accessing the region (123) in predefined types of operations such as read, write, execution, etc. The permission bits (e.g., 131, 133, . . . , 135) of the corresponding permission set (e.g., 111) controls the memory accesses of the corresponding types from a respective execution domain (e.g., 101).

Figure 5:
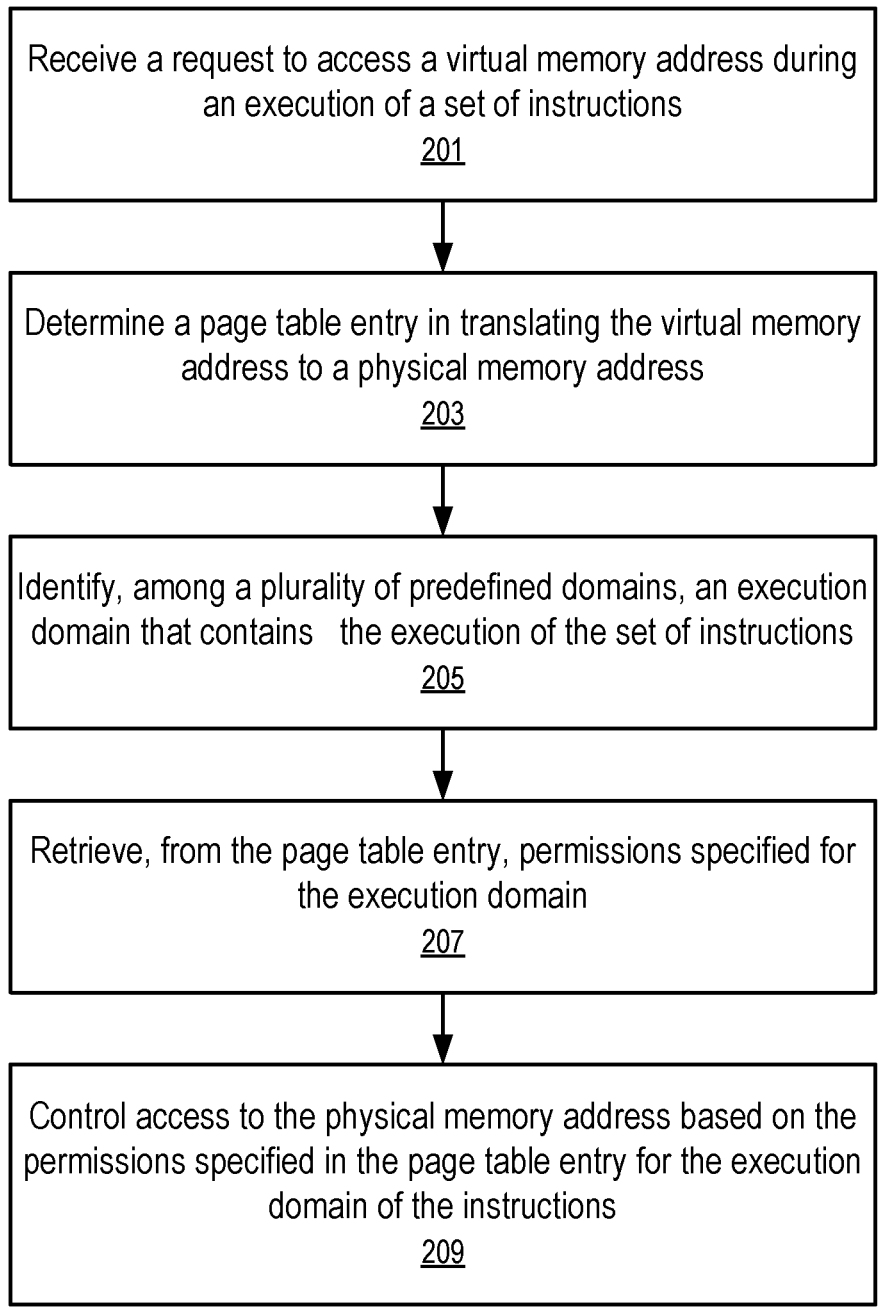
FIG. 5 shows a method to control memory access through permissions specified in page table entries for execution domains.

FIG. 5 shows a method to control memory access through permissions (107) specified in page table entries (e.g., 153) for execution domains (101, 103, . . . , 105).

For example, the method of FIG. 5 can be performed in a computer system of FIG. 4, using a page table (151) of FIG. 3, to provide permission bits (131, 133, . . . , 135) of FIG. 2 for predefined types of memory access operations in a region (123) for respective execution domains (101, 103, . . . , 105) illustrated in FIG. 1.

At block 201, a computer system (e.g., illustrated in FIG. 4) receives a request to access a virtual memory address (141) during an execution of a set of instructions.

For example, the set of instructions can be a routine of a hypervisor (102), an operating system (104), or an application (106). Thus, the execution of the routine can be classified as in one of the set of predetermined domains (101, 103, . . . , 105) illustrated in FIG. 1.

At block 203, the memory management unit (MMU) (181) (or the processor (169) of the computer system) determines a page table entry (153) in translating the virtual memory address (141) to a physical memory address (159), as illustrated in FIG. 3.

At block 205, the memory management unit (MMU) (181) (or the processor (169) of the computer system) identifies, among a plurality of predefined domains (101, 103, . . . , 105), an execution domain (e.g., 101) that contains the execution of the set of instructions.

For example, memory addresses for loading the instructions of a routine can include an object identifier that determines the domain (e.g., 101, 103, . . . , 105) when the routine is loaded for execution in the processor (169). In other examples, the object identifier is part of the virtual address space and does not specify a domain. In some implementations, the page table entry (153) includes information identifying the domain of routines stored in the memory region (123) identified by the page table entry (153).

For example, a register (183) of the processor can store the identifier of the domain of a routine while the routine is being executed in the processor (169).

At block 207, the memory management unit (MMU) (181) (or the processor (169) of the computer system) retrieves, from the page table entry (153), permissions (107) specified for the execution domain (e.g., 101, 103, . . . , or 105).

For example, the permissions (107) can be stored at a predetermined location in the page table entry (153).

At block 209, the memory management unit (MMU) (181) (or the processor (169) of the computer system) controls access to the physical memory address (129) based on the permissions (107) specified in the page table entry (153) for the execution domain of the instructions.

For example, the permissions sets (111, 113, . . . , 115) for respective domains (101, 103, . . . , 105) can be stored at predetermined locations within the page table entry (153); and the permissions (131, 133, . . . , or 135) for respective types of memory access operations (e.g., read, write, . . . , or execution) for each domain (e.g., 101, 103, . . . , or 105) is stored at predetermined locations within the permission set (e.g., 111, 113, . . . , or 115) for a respective execution domain (101, 103, . . . , 105). Thus, based on the execution domain of the instructions and the type of memory access operations (e.g., read, write, . . . , or execution), the memory management unit (MMU) (181) (or the processor (169) of the computer system) can extract a permission bit (e.g., 131, 133, . . . , 135) and determine whether the memory access operation is permitted according to the extracted permission bit.

The techniques disclosed herein can be applied to at least to computer systems where processors are separated from memory and processors communicate with memory and storage devices via communication buses and/or computer networks. Further, the techniques disclosed herein can be applied to computer systems in which processing capabilities are integrated within memory/storage. For example, the processing circuits, including executing units and/or registers of a typical processor, can be implemented within the integrated circuits and/or the integrated circuit packages of memory media to performing processing within a memory device. Thus, a processor (e.g., 101) as discussed above and illustrated in the drawings is not necessarily a central processing unit in the von Neumann architecture. The processor can be a unit integrated within memory to overcome the von Neumann bottleneck that limits computing performance as a result of a limit in throughput caused by latency in data moves between a central processing unit and memory configured separately according to the von Neumann architecture.

The description and drawings of the present disclosure are illustrative and are not to be construed as limiting. Numerous specific details are described to provide a thorough understanding. However, in certain instances, well known or conventional details are not described in order to avoid obscuring the description. References to one or an embodiment in the present disclosure are not necessarily references to the same embodiment; and, such references mean at least one.

In the foregoing specification, the disclosure has been described with reference to specific exemplary embodiments thereof. It will be evident that various modifications can be made thereto without departing from the broader spirit and scope as set forth in the following claims. The specification and drawings are, accordingly, to be regarded in an illustrative sense rather than a restrictive sense.

What is claimed is:

1. A computer system, comprising:
    a memory configured to at least store instructions of routines of a predefined set of domains;
    a processor coupled with the memory; and
    a memory management unit coupled between the processor and the memory, wherein the memory management unit is configured to manage a page table containing a page table entry that includes a permission bit for a type of memory access for each of the domains in the predefined set;
    wherein the memory management unit is configured to map a virtual memory address to a physical memory address using the page table entry during an execution of a routine that is in a first domain;
    wherein the memory management unit is further configured to control, in accordance with a respective permission bit for the first domain, the memory access of the type in response to an instruction of the routine causing the processor to use the virtual memory address to access the physical memory address.
2. The computer system of claim 1, wherein the page table entry includes a base for a page of physical addresses.
3. The computer system of claim 2, wherein the memory management unit is configured to combine the base and an offset specified in the virtual memory address to generate the physical address.
4. The computer system of claim 3, wherein the predefined set of domains comprises at least one of a domain for hypervisor, a domain for operating system, or a domain for application, or any combination thereof.
5. The computer system of claim 3, wherein the base provided in the page table entry identifies a region of physical memory.
6. The computer system of claim 5, wherein the page table entry includes a permission bit for routines in the first domain to perform read operations in the region of physical memory.
7. The computer system of claim 5, wherein the page table entry includes a permission bit for routines in the first domain to perform write operations in the region of physical memory.
8. The computer system of claim 5, wherein the page table entry includes a permission bit for routines in the first domain to execute instructions loaded from the region of physical memory.
9. The computer system of claim 1, wherein the virtual memory address includes a plurality of virtual page numbers, including a last virtual page number; and the memory management unit is configured to index into the page table using the last virtual page number to locate the page table entry.
10. The computer system of claim 9, wherein the page table is a last page table; and the memory management unit is further configured to index into a first page table using a first virtual page number in the plurality of virtual page numbers to retrieve a first page table entry that identifies the last page table; and the first page table entry contains permission bits for the predefined set of domains in performing a plurality types of operations in accessing a memory region corresponding to physical addresses defined via the last page table.
11. The computer system of claim 9, wherein the memory management unit is configured to control the memory access of the type based at least in part on a permission bit specified in the first page table entry.
12. A method, comprising:
    receiving a request to access a virtual memory address during an execution of a set of instructions in a computer processor;
    determining a page table entry in translating the virtual memory address to a physical memory address;
    identifying, among a plurality of predefined domains, an execution domain that contains the execution of the set of instructions;
    retrieving, from the page table entry, a permission bit specified for the execution domain and specified for a type of the request; and
    controlling the request to access the physical memory address based on the permission bit.
13. The method of claim 12, further comprising:
    extracting a base from the page table entry;
    extracting an offset from a predetermined field of the virtual memory address; and
    combining the base and an offset to generate the physical memory address.
14. The method of claim 13, wherein the plurality of predefined domains includes a domain for hypervisor.

15. The method of claim 13, wherein the plurality of predefined domains includes a domain for operating system.

16. The method of claim 13, wherein the base identifies a region of physical memory; and the type of request to access the region of the physical memory is controlled based at least in part on a value of the permission bit.

17. The method of claim 16, wherein the type comprises at least one of read, write, or execution, or any combination thereof.

18. A computing device, comprising:
- at least one register;
- at least one execution unit; and
- a memory management unit configured to manage a page table entry containing permission bits corresponding to predefined types of memory accesses made by executions of routines in predefined domains;
- wherein, in response to a routine executed in the computing device accessing a virtual memory address,
  - the memory management unit is configured to generate a physical memory address using the page table entry; and
  - the computing device is configured to determine whether to reject the routing accessing the virtual memory address based on a permission bit corresponding to an execution domain of the routine and a type of memory access made using the virtual memory address.

19. The computing device of claim 18, wherein the predefined types of memory accesses comprise read data from virtual addresses, write data to virtual addresses, or execute instructions stored at virtual addresses, or any combination thereof.

20. The computing device of claim 19, wherein the predefined domains comprise at least one of a domain of hypervisor, a domain of operating system, or a domain of application, or any combination thereof.

\* \* \* \* \*